United States Patent
Chen et al.

(10) Patent No.: US 8,446,730 B2
(45) Date of Patent: May 21, 2013

(54) PACKAGE OF ENVIRONMENTAL SENSITIVE ELEMENT

(75) Inventors: Kuang-Jung Chen, Hsinchu County (TW); Shu-Tang Yeh, Taichung County (TW); Jia-Chong Ho, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 332 days.

(21) Appl. No.: 12/703,155

(22) Filed: Feb. 9, 2010

(65) Prior Publication Data

US 2011/0063808 A1 Mar. 17, 2011

(30) Foreign Application Priority Data

Sep. 15, 2009 (TW) ............................... 98131092 A

(51) Int. Cl.
*H05K 1/00* (2006.01)
(52) U.S. Cl.
USPC ........... 361/750; 361/749; 361/751; 313/512; 206/204; 428/76; 257/295; 257/421
(58) Field of Classification Search
USPC ........... 361/750, 749, 751; 313/512; 206/204; 428/76; 257/295, 421
See application file for complete search history.

(56) References Cited

U.S. PATENT DOCUMENTS

| | | | |
|---|---|---|---|
| 5,855,994 A | 1/1999 | Biebuyck et al. | |
| 6,624,568 B2 | 9/2003 | Silvernail | |
| 2003/0042562 A1* | 3/2003 | Giebeler et al. | 257/421 |
| 2003/0048074 A1* | 3/2003 | Ni et al. | 313/512 |
| 2004/0150332 A1* | 8/2004 | Hwang et al. | 313/512 |
| 2004/0197944 A1 | 10/2004 | Chen et al. | |
| 2005/0145909 A1* | 7/2005 | Giebeler et al. | 257/295 |
| 2005/0179379 A1 | 8/2005 | Kim | |
| 2005/0285519 A1* | 12/2005 | Cok | 313/512 |
| 2005/0285520 A1* | 12/2005 | Cok | 313/512 |
| 2006/0006798 A1 | 1/2006 | Buckley | |
| 2007/0049155 A1 | 3/2007 | Moro et al. | |
| 2007/0241674 A1 | 10/2007 | Chao et al. | |
| 2008/0012477 A1 | 1/2008 | Koo et al. | |
| 2008/0259576 A1* | 10/2008 | Johnson et al. | 361/749 |
| 2009/0072734 A1* | 3/2009 | Harada et al. | 313/512 |
| 2011/0063808 A1* | 3/2011 | Chen et al. | 361/750 |
| 2012/0024722 A1* | 2/2012 | Chen | 206/204 |
| 2012/0064278 A1* | 3/2012 | Chen | 428/76 |

* cited by examiner

*Primary Examiner* — Xiaoliang Chen
(74) *Attorney, Agent, or Firm* — Jianq Chyun IP Office

(57) ABSTRACT

A package of an environmental sensitive element including a flexible substrate, an environmental sensitive element, a flexible sacrificial layer and a packaging structure is provided. The environmental sensitive element is disposed on the flexible substrate. The flexible sacrificial layer is disposed on the environmental sensitive element, wherein the environmental sensitive element includes a plurality of first thin films and the flexible sacrificial layer includes a plurality of second thin films. The bonding strength between two adjacent second thin films is substantially equal to or lower than the bonding strength between two adjacent first thin films. Further, the packaging structure covers the environmental sensitive element and the flexible sacrificial layer.

27 Claims, 4 Drawing Sheets

PACKAGE OF ENVIRONMENTAL SENSITIVE ELEMENT

CROSS-REFERENCE TO RELATED APPLICATION

This application claims the priority benefit of Taiwan application serial no. 98131092, filed on Sep. 15, 2009. The entirety of the above-mentioned patent application is hereby incorporated by reference herein and made a part of specification.

BACKGROUND OF THE INVENTION

1. Field of the Invention

The present invention relates to a package of an environmental sensitive element, and more particularly to a package of an environmental sensitive element having a flexible sacrificial layer.

2. Description of Related Art

Compared with normal rigid substrates, the flexible substrates have a wider range of applications due to their advantages of flexibility, ease of carriage, safety, and wider product application range. However, the drawbacks of the flexible substrate include poor resistance to heat, moisture, oxygen, and chemicals and large thermal expansion coefficient. Since typical flexible substrates cannot entirely avoid the transmission of water vapor and oxygen, devices on these substrates experience accelerated aging. Consequently, these short-lived devices fail to meet their commercial needs. Besides, since the flexible substrate has flexibility, when the flexible substrate is bent, the OLED structure will be damaged by bending force. Thus, the OLED device cannot normally operate.

In the conventional technologies, such as those described in the U.S. Pat. No. 6,624,568 and in the US Patent Publication No. 2007/0049155, the polymer is used as the packaging material for the organic electro-emitting element. Although the resistance to moisture and the oxygen of the polymer is relatively better, the conventional technologies never consider the delaminating problem while the OLED device is bent. Therefore, how to improve the delaminating phenomenon of the OLED device while it is bent is one of the immediate problems to be resolved in the current flexibility of the OLED device.

SUMMARY OF THE INVENTION

The present invention provides a package of an environmental sensitive element having a relatively better flexibility.

The present invention provides a package of an environmental sensitive element, wherein the package includes a flexible substrate, an environmental sensitive element, a flexible sacrificial layer and a packaging structure. The environmental sensitive element is disposed on the flexible substrate. The flexible sacrificial layer is disposed on the environmental sensitive element, wherein the environmental sensitive element includes a plurality of first thin films and the flexible sacrificial layer includes a plurality of second thin films, and the bonding strength between two adjacent second thin films is substantially equal to or lower than the bonding strength between two adjacent first thin films. The packaging structure covers the environmental sensitive element and the flexible sacrificial layer.

According to the above description, since the flexible sacrificial layer is formed on the environmental sensitive element, when the environmental sensitive element is bent, the delaminating happens in the flexible sacrificial layer. Therefore, the environmental sensitive element effective structure can be prevented from the delaminating phenomenon due to being bent.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

Figure 1A:
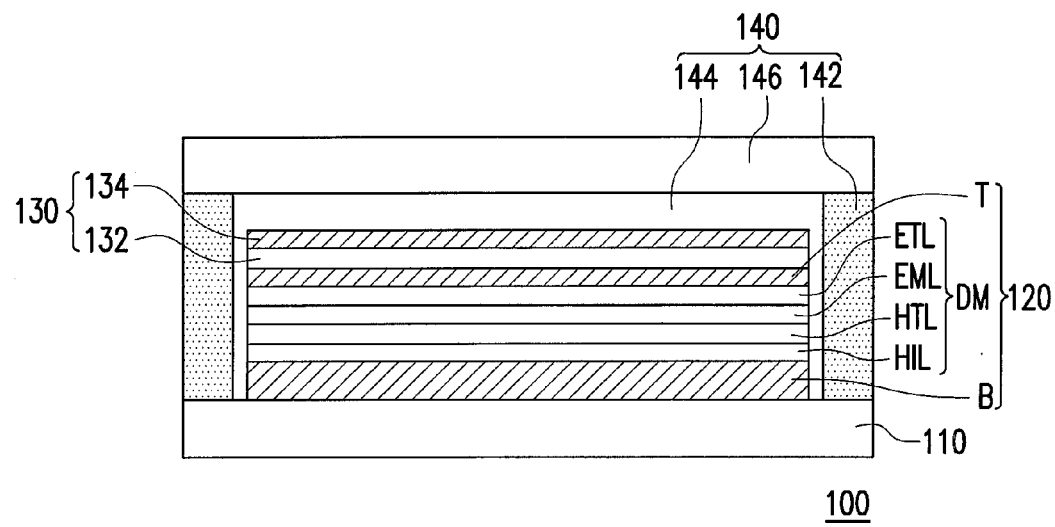
FIG. 1A, FIG. 1B, FIG. 1C and FIG. 1D are the cross-sectional views of a package of an environmental sensitive element according to the first embodiment of the present invention.
Figure 1B:
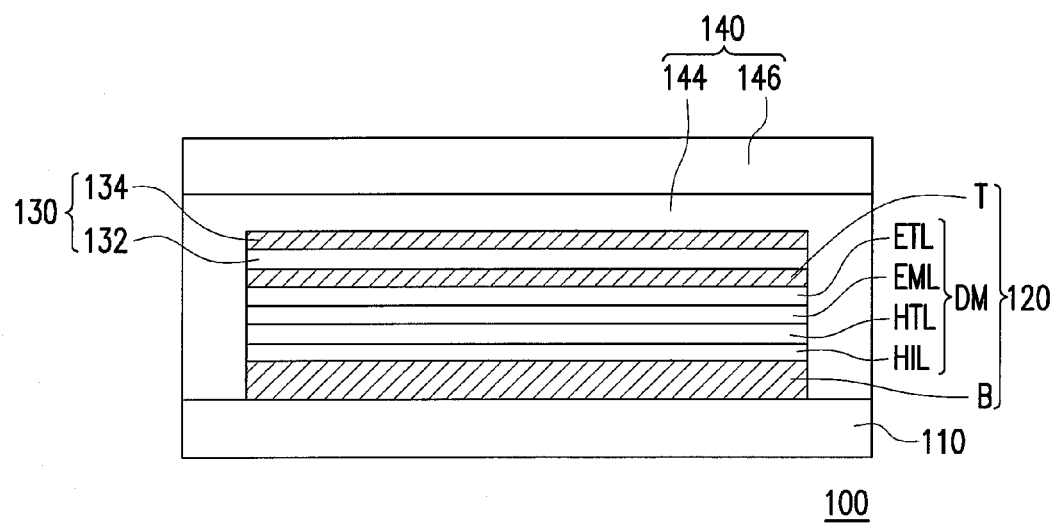

FIG. 1A and FIG. 1B are the cross-sectional views of a package of an environmental sensitive element according to the second embodiment of the present invention. As shown in FIG. 1A and FIG. 1B, a package 100 of an environmental sensitive element of the present embodiment includes a flexible substrate 110, an environmental sensitive element 120, a flexible sacrificial layer 130 and a packaging structure 140. The environmental sensitive element 120 is disposed on the flexible substrate 110. The flexible sacrificial layer 130 is disposed on the environmental sensitive element 120, wherein the environmental sensitive element 120 includes a plurality of first thin films (DM, B, T) and the flexible sacrificial layer 130 includes a plurality of second thin films (132 and 134) which are stacked on each other. Further, the bonding strength between two adjacent second thin films (132 and 134) is substantially equal to or lower than the bonding strength between two adjacent first thin films (DM, B, T). The packaging structure 140 covers the environmental sensitive element 120 and the flexible sacrificial layer 130.

In the present embodiment, material of the flexible substrate 110 can be, for example, plastic material such as PE plastic, PMMA, PC (polycarbonate) or PI (polyimide). For instance, the PE plastic can be the flexible plastic material such as PEC, PEN and PES. Moreover, the material of the flexible substrate 110 comprises metal foil.

As shown in FIG. 1A, the environmental sensitive element 120 comprises a bottom electrode layer B, a displaying medium DM and a top electrode layer T. The bottom electrode layer B is disposed on the flexible substrate 110, the displaying medium DM is disposed on bottom electrode layer B and the top electrode layer T is disposed on the displaying medium DM. More clearly, the displaying medium DM is composed of a hole injection layer HIL, a hole transporting layer HTL, an organic electro-emitting layer EML and an electron transporting layer ETL. The hole injection layer HIL is disposed on the bottom electrode layer B, the hole transporting layer HTL is disposed on the hole injection layer HIL, the organic electro-emitting layer EML is disposed on the hole transporting layer HTL, and the electron transporting layer ETL is disposed on the organic electro-emitting layer EML. Furthermore, the top electrode layer T is disposed on the electron transporting layer ETL.

The environmental sensitive element 120 of the present embodiment can be an active matrix element or a passive matrix element. When the environmental sensitive element 120 is the active matrix element, the bottom electrode layer B can be, for example, a pixel electrode of the thin film transistor array and the top electrode layer can be, for example, a common electrode. Meanwhile, the displaying medium between each of the pixel electrodes and the common electrode can be individually driven to emit lights. When the environmental sensitive element 120 is the passive matrix element, the bottom electrode layer B and the top electrode layer are the stripe electrodes, and the bottom electrode layer B and the top electrode layer T are arranged in an interlacing manner. Meanwhile, the displaying medium located at the crossover section where each of the top electrode layer T interlaces the bottom electrode layer B can be individually driven to emit lights. In the present embodiment, the extending direction of the bottom electrode layer B can be, for example, substantially perpendicular to the extending direction of the top electrode layer T.

As shown in FIG. 1A, the flexible sacrificial layer 130 comprises a sacrificial thin film 132 and a flexible protecting thin film 134, wherein the sacrificial thin film 132 is configured on the top electrode layer T of the environmental sensitive element 120 and the flexible protecting thin film 134 is configured on the sacrificial thin film 132. It should be noticed that, the sacrificial thin film 132 of the present embodiment is connected to the top electrode layer T, but the flexible protecting thin film 134 is disconnected to the top electrode layer T. However, in other embodiments of the present invention, the flexible protecting thin film 134 disposed on the sacrificial thin film 132 can be connected to the top electrode layer T. The bonding strength between the sacrificial thin film 132 and the top electrode layer T is substantially equal to or lower than the bonding strength between two adjacent first thin films (DM, B and T) so that the delaminating phenomenon hardly happens between the adjacent first thin films (DM, B and T) but easily happens on the interface between the sacrificial thin film 132 and the top electrode layer T and on the interface between the sacrificial thin film 132 and the flexible protecting thin film 134 when the package of the environmental sensitive element is bent. Therefore, the sacrificial thin film 132 and the flexible protecting thin film 134 can effectively protect the first thin films (DM, B and T) from having delaminating phenomenon during the package is bent.

In the present embodiment, the material of the sacrificial thin films includes organic small molecular compounds, organic oligomers, metal or organic-inorganic co-evaporated material. The molecular weight of the aforementioned organic small molecular material is about 10 g/mol~5000 g/molm and the organic small molecular material includes Tris-(8-hydroxyquinoline)aluminum, alpha-NPB N, N'-Dis(naphthalene-1-yl)-N,N'-diphenyl-benzidine, CuPc Phalocyanine or copper complex. The molecular weight of the organic oligomers is about 500 g/mol~9000 g/molm and the organic oligomers include Phenylene Vinylene Oligomers or Fluorene Oligomers. The molecular weight of metal or organic-inorganic co-evaporated material is about 3 g/mol~500 g/molm. More clearly, the aforementioned metal can be, for example, Al, Ag, Be, Cr, Cu, Co, Fe, Ge, Ir, In, Mo, Mn, Mg, Ni, Nb, Pb, Pd, Pt, Ru, Rh, Sn, Si, Sb, Se, Ti, Ta, Te, V, W, Zr, Zn, Mg—Ag, Al—Si, Al—Si—Cu, Au/Ge, Au—Be, Au—Ge—N, Ni—Cr, Pb—sn or In—Sn. Moreover, the material of the flexible protecting thin film 134 comprises indium tin oxide (ITO), indium zinc oxide (IZO), aluminum doped zinc oxide (AZO), $WO_3$, $MoO_3$, $SiO_x$, $SiN_x$, $SiO_xN_y$, $Al_2O_3$, Al, Ag, Mg—Ag or Mg—Al. It should be noticed that the materials of the sacrificial thin film 132 and the flexible protecting thin film 134 in the flexible sacrificial layer 130 are selected from different material groups such that the bonding strength between the sacrificial thin film 132 and the flexible protecting thin film 134 is substantially equal to or smaller than the bonding strength between the adjacent first thin films (DM, B and T).

As shown in FIG. 1A, the packaging structure 140 comprises a sealant 142, an adhesion layer 144 and a flexible cover 146. The sealant 142 is disposed on the flexible substrate 110 to encircle the environmental sensitive element 120 and the flexible sacrificial layer 130. The adhesion layer 144 is disposed within the sealant 142 to cover the environmental sensitive element 120 and the flexible sacrificial layer 130. Further, the flexible cover 146 is connected with the sealant 142 and the adhesion layer 144.

As shown in FIG. 1B, the packaging structure 140 can also be other types of structure. For instance, the packaging structure can comprise an adhesion layer 144 and a flexible cover 146, wherein the adhesion layer 144 covers the environmental sensitive element 120 and the flexible sacrificial layer 130, and the flexible cover 146 is connected to the adhesion layer 144.

Figure 1C:
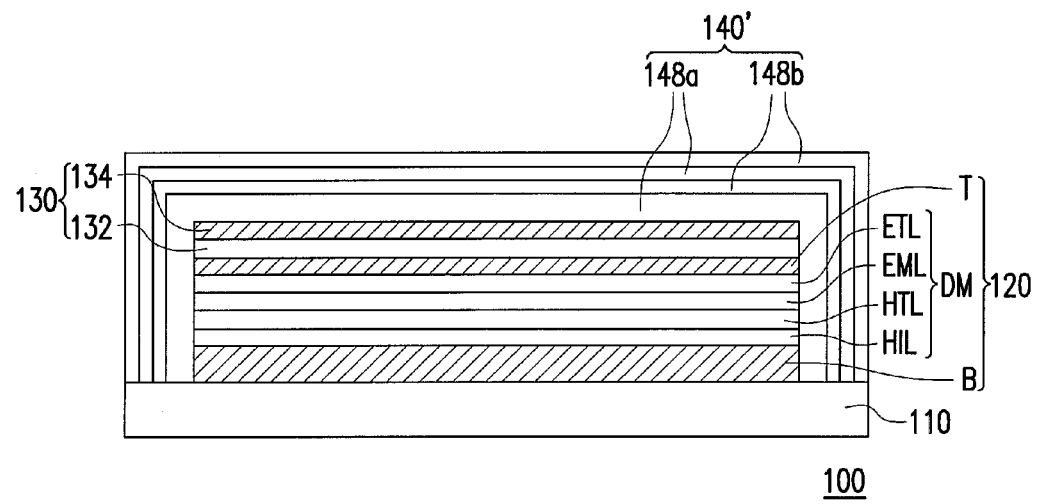

As shown in FIG. 1C, the packaging structure 140' with other packaging structure type is used in the present embodiment. For instance, the packaging structure 140' can comprise a plurality of package thin films. The package thin films include a plurality of organic package thin films 148a and a plurality of inorganic package thin films 148b. The organic thin films 148a and the inorganic thin films 148b are stacked on one another to provide a relatively better moisture-proof ability.

Figure 1D:
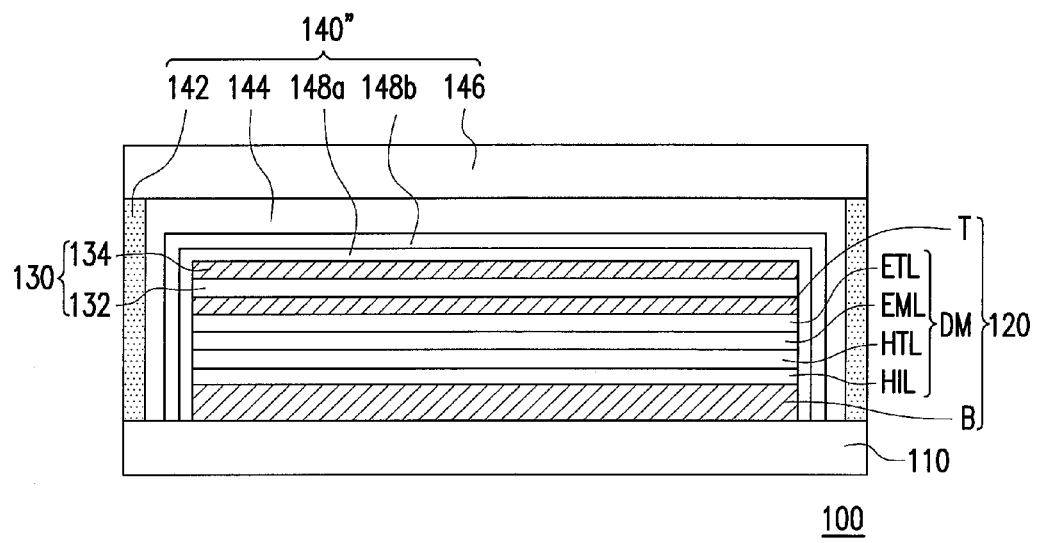

As shown in FIG. 1D, the packaging structure 140'' with other packaging structure type is used in the present embodiment. For instance, the packaging structure 140'' can comprise a sealant 142, an adhesion layer 144, a flexible cover 146, at least one layer of organic package thin films 148a and at least one layer of inorganic package thin films 148b. The organic thin films 148a and the inorganic thin films 148b are stacked on one another to provide a relatively better moisture-proof ability. The sealant 142 is disposed on the flexible substrate 110 to encircle the environmental sensitive element 120 and the flexible sacrificial layer 130. The adhesion layer 144 is disposed within the sealant 142 to cover the organic package thin films 148a, the inorganic package thin films 148b and the flexible sacrificial layer 130. Further, the flexible cover 146 is connected with the sealant 142 and the adhesion layer 144.

It should be noticed that the aforementioned organic package thin films 148a and the inorganic package thin film 148b can be arranged alone or alternatively stacked on one another.

In a preferred embodiment, the material of the top electrode layer T can be, for example, as same as the material of the flexible protecting thin film 134, and the material of the sacrificial thin film 132 can be, for example, as same as the material of the hole transporting layer HTL. Therefore, the process for forming the flexible sacrificial layer 130 can be integrated with the process for forming the environmental sensitive element 120. In other words, the flexible sacrificial layer 130 and the environmental sensitive element 120 can be manufactured in the same process chamber without further modifying the current process procedure.

Second Embodiment

Figure 2A:
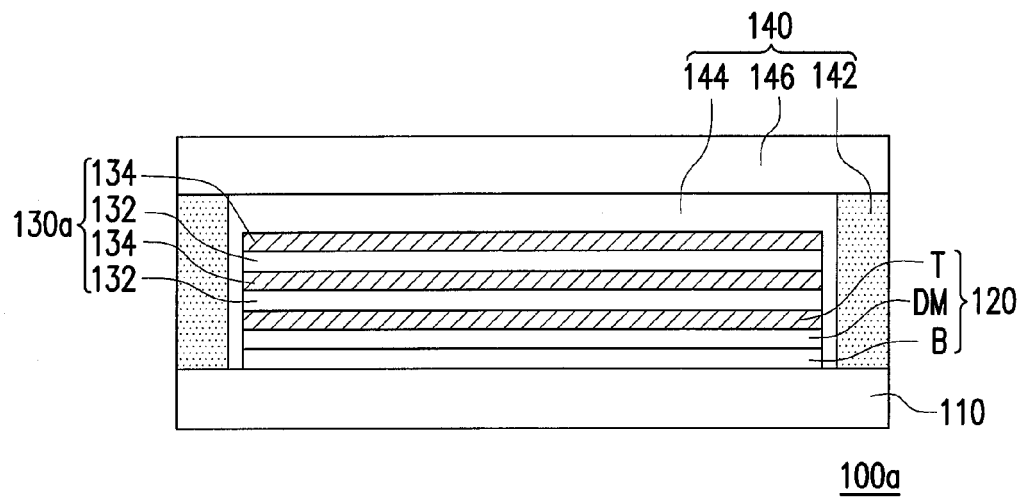
FIG. 2A and FIG. 2B are the cross-sectional views of a package of an environmental sensitive element according to the second embodiment of the present invention.
Figure 2B:
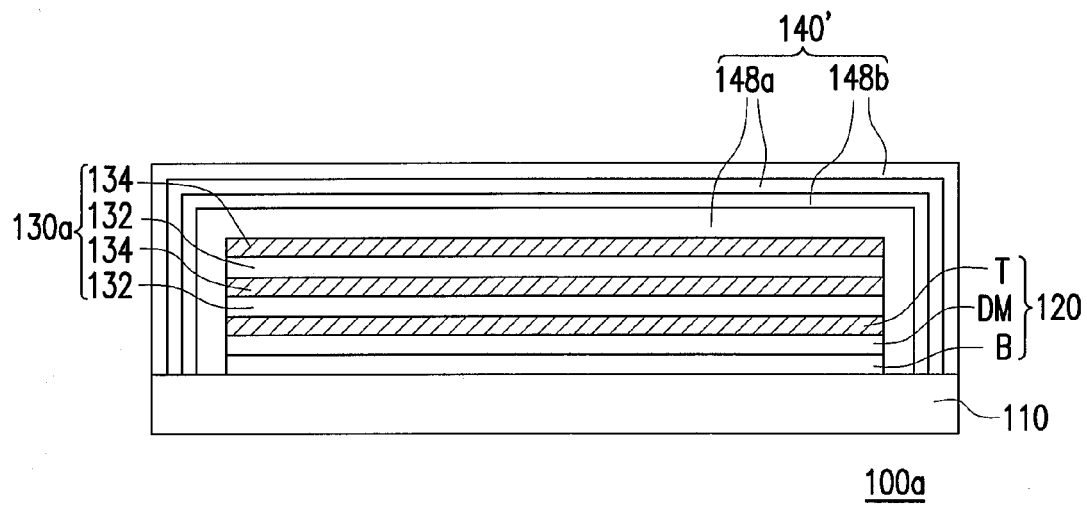

FIG. 2A and FIG. 2B are the cross-sectional views of a package of an environmental sensitive element according to the second embodiment of the present invention. As shown in FIG. 2A and FIG. 2B, the package 100a of the environmental sensitive element of the present embodiment is similar to the package 100 of the environmental sensitive element of the first embodiment. More clearly, the thin film structure of the flexible sacrificial layer 130a in the package 100a is different from that of the flexible sacrificial layer 130 in the package 100. The flexible sacrificial layer 130a comprises a plurality of sacrificial thin films 132 and a plurality of flexible protecting thin films 134, wherein the sacrificial thin films 132 and the flexible protecting thin films 134 are alternatively stacked on one another and are configured on the top electrode layer T of the environmental sensitive element 120 and the bottommost sacrificial thin film 132 is connected to the top electrode layer T. Moreover, the flexible protecting thin films 134 of the present embodiment are disconnected to the top electrode layer T.

The Third Embodiment

Figure 3A:
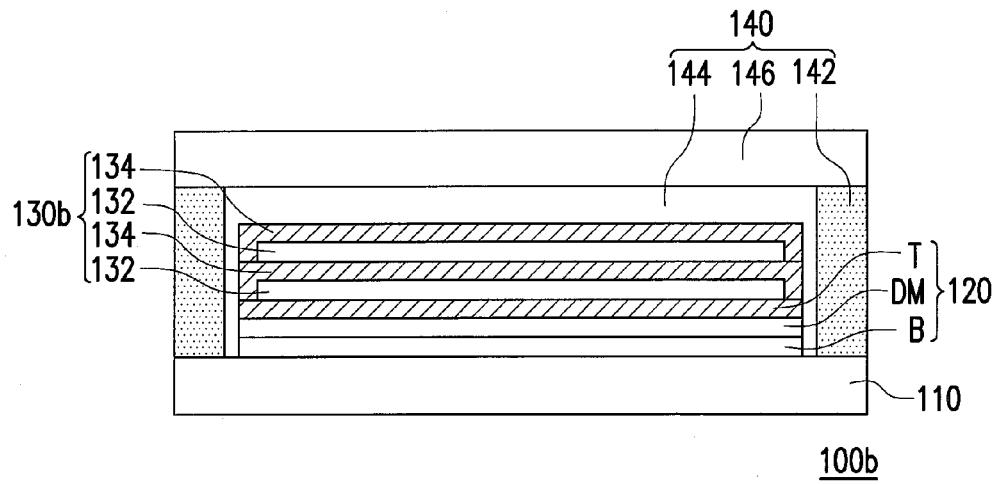
FIG. 3A and FIG. 3B are the cross-sectional views of a package of an environmental sensitive element according to the third embodiment of the present invention.
Figure 3B:
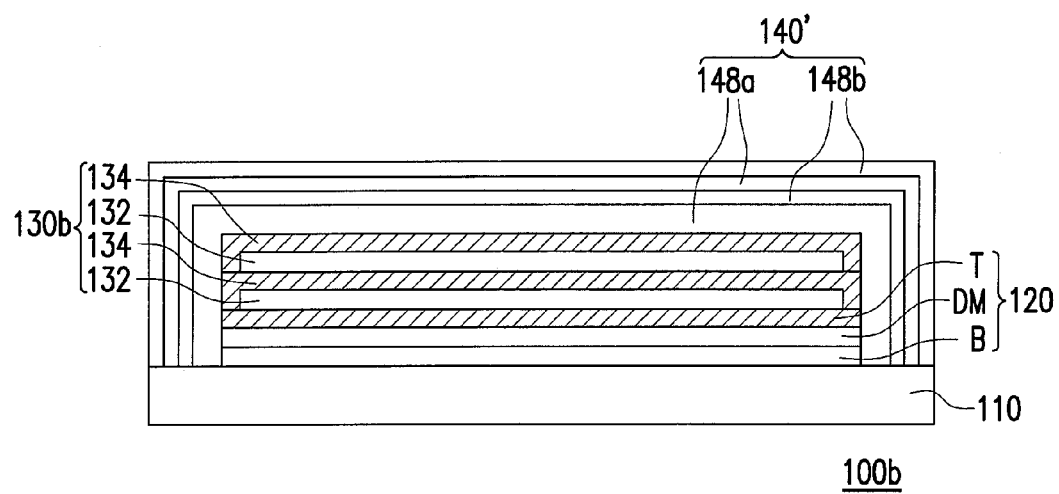

FIG. 3A and FIG. 3B are the cross-sectional views of a package of an environmental sensitive element according to the third embodiment of the present invention. As shown in FIG. 3A and FIG. 3B, the package 100b of the environmental sensitive element of the present embodiment is similar to the package 100a of the environmental sensitive element of the second embodiment. More clearly, the thin film structure of the flexible sacrificial layer 130b in the package 100b is different from that of the flexible sacrificial layer 130a in the package 100a. The flexible sacrificial layer 130b comprises a plurality of sacrificial thin films 132 and a plurality of flexible protecting thin films 134, wherein the sacrificial thin films 132 and the flexible protecting thin films 134 are alternatively stacked on one another and are configured on the top electrode layer T of the environmental sensitive element 120 and the bottommost sacrificial thin film 132 and all of the flexible protecting thin films 134 are connected to the top electrode layer T.

EXPERIMENTAL EXAMPLE

Table 1 is a detailed explanation of the structure of the package of the environmental sensitive element, wherein illuminant area of the package is about 0.3 centimeter×0.3 centimeter.

The package of the environmental sensitive element manufactured according to the standards of the experimental group I and control group I is normally lighting on before it goes through the bending test. After the bending test (the package is bent for 500 times with a radius of curvature of about 5 centimeter), the package of the environmental sensitive element of the control group I can not light on. The package of the environmental sensitive element of the experimental group I is driven by a voltage of 4V to light on with a brightness about 820 Cd/m^2 and a light emitting efficiency about 14.0 Cd/A before it goes through the bending test. After the bending test (the package is bent for 500 times with a radius of curvature of about 5 centimeter), the package of the environmental sensitive element of the experimental group I is driven by a voltage of 4V to light on with a brightness about 793 Cd/m^2 and a light emitting efficiency about 13.9 Cd/A Obviously, the light emitting efficiency of the package of the environmental sensitive element of the experimental group I (i.e. one of the embodiments of the present invention) does not significantly decayed.

According to the above embodiments and the experimental example, since the flexible sacrificial layer with various types is formed on the environmental sensitive element, when the environmental sensitive element is exaggeratedly bent, the delaminating happens in the flexible sacrificial layer. Therefore, the environmental sensitive element can be prevented from the delaminating phenomenon due to being bent and the light-emitting structure of the element can be prevented from being damaged during it is bent.

What is claimed is:

1. A package of an environmental sensitive element, comprising:
a flexible substrate;
an environmental sensitive element disposed on the flexible substrate, wherein the environmental sensitive element comprises an active matrix element or a passive matrix element;
a flexible sacrificial layer disposed on the environmental sensitive element, wherein the environmental sensitive element comprises a plurality of first thin films, the flexible sacrificial layer includes a plurality of second thin films, and the bonding strength between two adjacent second thin films is substantially equal to or lower than the bonding strength between two adjacent first thin films so that the delaminating phenomenon hardly happens between the adjacent first thin films when the flexible substrate, the environmental sensitive element and the flexible sacrificial layer are bent, wherein the first thin films in the active matrix element or the passive matrix element comprises a bottom electrode layer disposed on the flexible substrate, a displaying medium disposed on bottom electrode layer and a top electrode layer disposed on the displaying medium, and wherein the second thin films in the flexible sacrificial layer comprises:
a sacrificial thin film disposed on the top electrode layer, wherein the material of the sacrificial thin film includes organic small molecular material with the molecular weight about 10 g/mol~5000 g/mol or organic oligomers with the molecular weight about 500 g/mol~9000 g/mol;

TABLE 1

| | Lower Sustrate | Electrode | HTL | EML (Dopant:Host) | | ETL | EIL/top electrode | Flexible Structure Layer | Upper Substrate |
|---|---|---|---|---|---|---|---|---|---|
| Experimental group I | PES | ITO | NPB 200 Å | Ir(ppy)3 7% | CBP 300 Å | Bphen 300 Å | LiF5 Å/ Al 1500 Å | NPB/Al 1500 Å/ 1500 Å | Metal Foil |
| Control group I | PES | ITO | NPB 200 Å | Ir(ppy)3 7% | CBP 300 Å | Bphen 300 Å | LiF5 Å/ Al 1500 Å | NPB/Al 0 Å/0 Å | Metal Foil | a flexible protecting thin film disposed on the sacrificial thin film; and a packaging structure covering the environmental sensitive element and the flexible sacrificial layer.

2. The package of claim 1, wherein the sacrificial thin film is connected to the top electrode layer, and the flexible protecting thin film is disconnected to the top electrode layer.

3. The package of claim 1, wherein both of the sacrificial thin film and the flexible protecting thin film are connected to the top electrode layer.

4. The package of claim 1, wherein the bonding strength between the flexible sacrificial layer and the top electrode layer is substantially equal to or lower than the bonding strength between two adjacent first thin films.

5. The package of claim 1, wherein the material of the sacrificial thin film includes organic small molecular material or a mixture of oligomers and inorganic material, and the atomic weight or the molecular weight of the inorganic material is about 3 g/mol~500 g/mol.

6. The package of claim 1, wherein the material of the sacrificial thin film includes Tris-(8-hydroxyquinoline)aluminum, alpha-NPB N, N'-Dis(naphthalene-1-yl)-N, N'-diphenyl-benzidine, CuPc Phalocyanine or copper complex.

7. The package of claim 1, wherein the material of the flexible protecting thin film comprises indium tin oxide (ITO), indium zinc oxide (IZO), aluminum doped zinc oxide (AZO), $WO_3$, $MoO_3$, $SiO_x$, $SiN_x$, $SiO_xN_y$, $Al_2O_3$, Al, Ag, Mg—Ag or Mg—Al.

8. The package of claim 1, wherein the material of the top electrode layer is substantially equal to the material of the flexible protecting thin film.

9. The package of claim 1, wherein the second thin films in the flexible sacrificial layer comprises:

a plurality of sacrificial thin films; and a plurality of flexible protecting thin films, wherein the sacrificial thin films and the flexible protecting thin films are alternatively stacked on the environmental sensitive element, and the bottommost sacrificial thin film is connected to the top electrode layer.

10. The package of claim 9, wherein the bottommost sacrificial thin film is connected to the top electrode layer, and the flexible protecting thin films are disconnected to the top electrode layer.

11. The package of claim 9, wherein both of the bottommost sacrificial thin film and the flexible protecting thin films are connected to the top electrode layer.

12. The package of claim 9, wherein the bonding strength between the bottommost sacrificial thin film and the top electrode layer is substantially equal to or lower than the bonding strength between two adjacent first thin films.

13. The package of claim 9, wherein the material of the sacrificial thin films includes organic small molecular material with the molecular weight about 10 g/mol~5000 g/mol.

14. The package of claim 9, wherein the material of the sacrificial thin films includes organic oligomers with the molecular weight about 500 g/mol~9000 g/mol.

15. The package of claim 9, wherein the material of the sacrificial thin films includes organic small molecular material or a mixture of oligomers and inorganic material, and the atomic weight or the molecular weight of the inorganic material is about 3 g/mol~500 g/mol.

16. The package of claim 9, wherein the material of the sacrificial thin films includes Tris-(8-hydroxyquinoline)aluminum, alpha-NPB N, N'-Dis(naphthalene-1-yl)-N, N'-diphenyl-benzidine, CuPc Phalocyanine or copper complex.

17. The package of claim 9, wherein the material of the flexible protecting thin films comprises indium tin oxide (ITO), indium zinc oxide (IZO), aluminum doped zinc oxide (AZO), $WO_3$, $MoO_3$, $SiO_x$, $SiN_x$, $SiO_xN_y$, $Al_2O_3$, Al, Ag, Mg—Ag or Mg—Al.

18. The package of claim 9, wherein the material of the top electrode layer is substantially substantially equal to the material of the flexible protecting thin films.

19. The package of claim 1, wherein the material of the flexible substrate comprises plastic material or metal thin film.

20. The package of claim 1, wherein the packaging structure comprises a plurality of package thin films stacked by one another.

21. The package of claim 20, wherein the package thin films comprises at least a layer of organic package thin film or at least a layer of inorganic package thin film.

22. The package of claim 20, wherein the package thin films comprise:

a plurality of organic package thin films; and a plurality of inorganic package thin films, wherein the organic package thin films and the inorganic package thin films are alternatively stacked on one another.

23. The package of claim 1, wherein packaging structure comprises:

a sealant disposed on the flexible substrate to encircle the environmental sensitive element and the flexible sacrificial layer;

an adhesion layer disposed within the sealant to cover the environmental sensitive element and the flexible sacrificial layer; and a flexible cover connected with the sealant and the adhesion layer.

24. The package of claim 1, wherein packaging structure comprises:

an adhesion layer covering the environmental sensitive element and the flexible sacrificial layer; and a flexible cover connected with the adhesion layer.

25. The package of claim 1, wherein packaging structure comprises:

a sealant disposed on the flexible substrate to encircle the environmental sensitive element and the flexible sacrificial layer;

an adhesion layer disposed within the sealant to cover the environmental sensitive element and the flexible sacrificial layer;

a flexible cover connected with the sealant and the adhesion layer; and at least one layer of organic package thin film.

26. The package of claim 1, wherein packaging structure comprises:

a sealant disposed on the flexible substrate to encircle the environmental sensitive element and the flexible sacrificial layer;

an adhesion layer disposed within the sealant to cover the environmental sensitive element and the flexible sacrificial layer; and a flexible cover connected with the sealant and the adhesion layer; and at least one layer of inorganic package thin film.

27. The package of claim 1, wherein packaging structure comprises:

a sealant disposed on the flexible substrate to encircle the environmental sensitive element and the flexible sacrificial layer;

an adhesion layer disposed within the sealant to cover the environmental sensitive element and the flexible sacrificial layer;
a flexible cover connected with the sealant and the adhesion layer;
a plurality of organic package thin films; and
a plurality of inorganic package thin films, wherein the organic package thin films and the inorganic package thin films are alternatively stacked on one another.

* * * * *